(12) United States Patent
Curro et al.

(10) Patent No.: US 6,762,123 B2
(45) Date of Patent: Jul. 13, 2004

(54) MOISTURE CORROSION INHIBITOR LAYER FOR AL-ALLOY METALLIZATION LAYERS, PARTICULARLY FOR ELECTRONIC DEVICES AND CORRESPONDING MANUFACTURING METHOD

(75) Inventors: Giuseppe Curro, Messina (IT); Antonio Scandurra, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/345,706

(22) Filed: Jan. 16, 2003

(65) Prior Publication Data

US 2003/0107109 A1 Jun. 12, 2003

Related U.S. Application Data

(62) Division of application No. 09/717,936, filed on Nov. 21, 2000, now Pat. No. 6,525,404.

(30) Foreign Application Priority Data

Nov. 22, 1999 (EP) .............................................. 99830718

(51) Int. Cl.[7] ...................... H01L 21/44; H01L 21/4763
(52) U.S. Cl. ...................................... 438/688; 438/636
(58) Field of Search ................................ 438/114, 465, 438/636, 688, 761, 763; 257/626, 629, 632, 635, 636, 637, 761, 771, 765

(56) References Cited

U.S. PATENT DOCUMENTS 2,515,934 A   7/1950 Verner et al. ................ 148/248
3,986,897 A   10/1976 McMillan et al. .......... 438/510
4,082,604 A   4/1978 Yanez ......................... 438/673
4,896,204 A   1/1990 Hirata et al. ................ 257/765
5,733,364 A   3/1998 Schmid et al. .............. 106/403

FOREIGN PATENT DOCUMENTS

| DE | 2162078 | 7/1972 | ............. C23F/7/14 |
| DE | 2749294 | 5/1979 | ............. H01L/21/60 |
| EP | 0357219 | 3/1990 | ............. C25D/11/06 |
| FR | 1246716 | 2/1961 | |
| FR | 2312117 | 12/1976 | ............. H01L/21/88 |
| GB | 396746 | 8/1933 | |
| JP | 2-116132 | 4/1990 | |

OTHER PUBLICATIONS

Patent Abstracts of Japan, vol. 011, No. 190 (E–517), Jun. 18, 1987, & JP 62 020351 A (NEC Corp.), Jan. 28, 1987.
Patent Abstracts of Japan, vol. 12, No. 072 (E–588), Mar. 5, 1988 & JP 62 213264 A (NEC Corp) Sep. 19, 1987.

*Primary Examiner*—Hung Vu
(74) *Attorney, Agent, or Firm*—Lisa K. Jorgenson; Allen, Dyer, Doppelt, Milbrath & Gilchrist, P.A.

(57) ABSTRACT

A method of producing a protective inhibitor layer of moisture-generated corrosion for aluminum (Al) alloy metallization layers, particularly in semiconductor electronic devices, includes chemically treating the metallization layer in at least two steps using a mixture of concentrated nitric acid and trace phosphoric acid to produce a thin protective phosphate layer. Alternatively, the method may include dipping the electronic device at least once in a mixture of a polar organic solvent and phosphoric acid ($H_3PO_4$) or phosphate derivatives thereof in a low percentage amount (e.g., with a phosphate reactant such as orthophosphoric acid or even R—$H_xPO_y$, where R is an alkaline type of ion group or an alkyl radical). The thin film may be formed on top of a thin layer of native aluminum oxide hydrate $Al_2O_3 \cdot xH_2O$.

23 Claims, 2 Drawing Sheets

MOISTURE CORROSION INHIBITOR LAYER FOR AL-ALLOY METALLIZATION LAYERS, PARTICULARLY FOR ELECTRONIC DEVICES AND CORRESPONDING MANUFACTURING METHOD

This application is a divisional of Ser. No. 09/717,936 filed on Nov. 21, 2000, now U.S. Pat. No. 6,525,404, the disclosure of which is hereby incorporated by reference in its entirety.

FIELD OF THE INVENTION

The present invention relates to the field of microelectronic devices, and, more particularly, to an inhibitor layer for inhibiting moisture-generated corrosion of aluminum (Al) alloy metallization layers in microelectronic devices and to a method of fabricating such a layer for semiconductor integrated electronic devices.

BACKGROUND OF THE INVENTION

As is well known in the art, corrosion of a final metallization layer typically occurs when electronic devices are assembled and encapsulated in plastic packages. Such corrosion presents a serious problem of reliability in the manufacture of semiconductor integrated electronic devices. For example, the performance of power devices incorporating metal oxide semiconductor (MOS) power transistors is deeply affected by corrosion of the metal layer on the device surface. This effect becomes more acute as the dimensions of integrated circuits grow smaller.

A determining value for satisfactory operation of a semiconductor device is its resistance in the power-on condition. This resistance value can be significantly altered by oxidation of the metal layer on the device surface. In power devices, the metal layer is coincident with the source electrode of the power MOS. Surface metallization is common practice in the semiconductor industry and involves depositing a layer of an aluminum alloy (typically Al—Si (1% w/o)) in semiconductor devices. Electromigration in semiconductor devices is of less concern than in power switches using power MOS.

The corrosive phenomenon in a damp environment can start at the surface of the Al—Si alloy whenever condensation collects thereon. This is because water contains a sufficient concentration of corrosive ion impurities dissolved therein. Water from condensation can also form locally on the metal layer surface, e.g., as a result of water penetrating the package and the molding protection resin during tests for operability in moisture. Such operability tests are occasionally carried out inside pressure cookers.

Certain ion species flowing between the cathodic and the anodic surface regions may be released from the molding resin itself. They may also be contaminants in the materials used for making the integrated circuit. The molding resin, further to absorbing and possibly becoming saturated with water, can act as an electrolytic medium. Yet, the diffusion of ions and electrons through the resin layer makes it difficult to retard and ultimately check the corrosive processes.

It should also be noted that an electrolytic cell may form on the alloy layer surface. Its cathode and anode usually are two electrodes of the device (e.g., the gate and source metal contacts in a MOS power transistor) or may be the gold bonding wire and the surrounding surface of the Al metallization layer.

The Al metallization layer is normally coated with a very thin (a few tens) of Angstroms layer of native oxide hydrate which preserves the metal beneath from further corrosion in standard environmental conditions. However, this native layer becomes eroded where the condensed electrolyte has a sufficient amount of catalytic agents. In this case, the Al oxide hydrate is dissolved by chemical reaction. This results in the surface of the Al metal layer being rapidly brought to contact with the electrolyte. Furthermore, a galvanic corrosion mechanism is initiated in the Al layer through one of two possible reaction paths, according to the local pH value, as follows:

in an acidic medium, $$2Al+6H^+ \rightarrow 2Al^{3+}+3H_2$$

$$2Al^{3+}+6H_2O \rightarrow 2Al(OH)_3+6H^+$$

and in a basic medium, $$Al+3OH^- \rightarrow 2Al(OH)_3+3e^-$$

$$6O_2+6H_2O+12e^- \rightarrow 12OH^-$$

A first prior approach to making corrosion less likely to occur is based on forming a suitable inhibitor layer over the surface of the aluminum alloy layer. For this inhibitor layer to be effective, the layer and the processes for forming it must meet certain requirements. First, it must be consistent with the performance of the finished device. The chemical-physical characteristics of the other layers included in the integrated circuit should also be unaffected. Additionally, the inhibitor layers should be compatible with the subsequent steps of bonding the lead wires and packaging.

In plastic packaged devices, the aluminum metal layer surface is generally protected with a relatively thick layer of a passivation dielectric (e.g., SiN, Pvapox, SiON, etc.) which prevents water from migrating to the aluminum surface from the molding resin. In any event, the passivation dielectric must be conformed (e.g., by a photolithographic process and associated etch) to bond wires to the surface of the Al metal layer and produce the contacts.

In power devices where large currents are involved, bonding wires of diameters in the 2 to 20 mils range are typically used and require a relatively broad bonding area. The bonding ends represent uncovered metal regions and, accordingly, are potentially subject to the corrosive action of water in either saturated steam or liquid form. It can be appreciated, therefore, that the passivation dielectric ordinarily used cannot solve the above problem. Further process steps (e.g., dielectric depositing, masking, etching) are required which can introduce further problems from interaction with the underlying layers, as well as added cost.

The technical problem underlying this invention is to provide a protection or passivation for the metal layers present in semiconductor integrated circuits which exhibits appropriate structural and functional features to effectively protect the metal layer against corrosion. Such passivation should be provided without burdening the electronic device manufacture with additional complexity and cost. In this way, the aforementioned drawbacks of the prior art can be reduced.

SUMMARY OF THE INVENTION

The concept behind this invention is one of growing, over the metal layer, a very thin passivation phosphate layer or film to resist corrosion/hydroxidation of the metal when the latter is subjected to stresses in a damp environment.

Preferably, this thin film is grown by chemical treatment of the Al alloy metal layer surface.

According to the invention, a semiconductor device includes at least one aluminum alloy metallization layer, a native aluminum oxide hydrate layer on the at least one aluminum alloy metallization layer, and a protective inhibitor layer on the native aluminum oxide hydrate layer. The protective inhibitor layer may include phosphate and it reduces moisture-generated corrosion of the at least one aluminum alloy metallization layer.

More particularly, the protective inhibitor layer may include a mixture of ortho- and poly-phosphate grafted phases adjacent the native aluminum oxide hydrate layer. The protective inhibitor layer may be less than about 50 Å thick, and, more preferably, less than about 35 Å thick. The native aluminum oxide hydrate layer may be less than about 50 Å thick, and, more preferably, in a range of about 30 to 40 Å. Furthermore, the protective inhibitor layer may include aluminum phosphate and it may also be cured.

A method according to the invention of producing a protective inhibitor layer for reducing moisture-generated corrosion of aluminum alloy metallization layers in semiconductor devices includes chemically treating an aluminum alloy metallization layer at less than about 50° C. using concentrated nitric acid formed in a substantially non-aqueous solution. The method may also include chemically treating the aluminum alloy metallization layer at less than about 50° C. using a mixture comprising nitric acid and trace phosphoric acid formed in a substantially non-aqueous solution.

BRIEF DESCRIPTION OF THE DRAWINGS

The features and advantages of the method and the inhibitor layer according to the invention will be apparent from the following description of embodiments thereof, given by way of non-limitative examples, with reference to the accompanying drawings.

DETAILED DESCRIPTION OF THE PREFERRED EMBODIMENTS

Figure 1A:
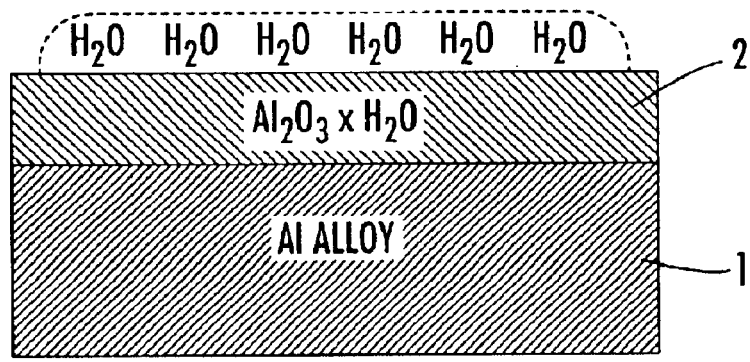
FIG. 1A is an enlarged vertical cross-section view showing schematically a portion of a semiconductor electronic device subjected to a step of the inventive method.

Referring to the drawing figures, in particular to FIG. 1A, a metallization layer 1 formed over a conventional semiconductor electronic device (not shown) is shown schematically. The metallization layer 1 may be an aluminum-silicon (Al—Si) alloy deposited using conventional techniques as the final interconnection layer between electronic components in a semiconductor integrated circuit.

The process steps and the structures described hereinafter do not describe a complete process for fabricating integrated circuits. The present invention, in fact, can be practiced concurrently with integrated circuit fabricating techniques presently used in the industry. Only such process steps as are necessary to explain the invention will be discussed hereinafter. Also, figures showing cross-sections through portions of an integrated circuit during its fabrication are not drawn to scale, but rather to highlight major features of the invention.

The semiconductor integrated circuit is formed on a semiconductor substrate being a part of a semiconductor wafer. This substrate may be doped P+ or doped N+. The semiconductor wafer has a face side surface which is still raw or unfinished, since it is intended to receive the layout of a device or an electronic circuit integrated monolithically in the semiconductor. The semiconductor wafer also has an underside surface, oppositely located from the face side surface. These face side and underside surfaces will also be referred to hereinafter as the front and the back of the semiconductor wafer.

In the method of the present invention, the surface of the Al alloy metal layer 1 is advantageously modified by application of another process step to the semiconductor wafer after completing the processing steps. The wafer front is covered with the aluminum metal layer, while on its back is deposited a metallization layer including plural layers (e.g., TiNiAu).

The method of the present invention leaves the surface of the metal layer on the wafer back unaltered (i.e., it does not "degrade" it). Accordingly, all of the subsequent processing steps, such as the die-attach process for bonding to the supporting frame used at the packaging stage, may be carried out as normal. A very thin phosphate layer or film 3 is advantageously provided, which reduces corrosion/hydroxidation of the metal as the latter undergoes stresses in a damp environment. Preferably, this thin film 3 is grown by a chemical surface treatment of the Al alloy metallization layer 1.

According to the invention, two different classes of chemical surface treatments of the Al layer are provided which produce a very thin phosphatised passivation layer exhibiting an anti-corrosion property in a damp environment. In essence, the method of this invention can be defined by a first embodiment and a modification thereof, both embodiments falling within the scope of the invention.

In the first embodiment, the surface of the metal layer 1 is subjected to a two-stage chemical treatment using a mixture of concentrated (e.g., about 100%) nitric acid and trace phosphoric acid. An outline of this first embodiment of the inventive method is as follows:

Step 1) Dipping or wetting the wafer in/with concentrated nitric acid ($HNO_3$):
  temperature—40 to 50° C.;
  time—at least 10 minutes.
Step 2) Dipping or wetting the wafer in/with a mixture of $HNO_3$ and trace phosphoric acid ($H_3PO_4$), e.g., 0.005 to 0.01% v/v phosphoric acid:
  temperature—40 to 50° C.;
  time—10 to 20 minutes.
This step preferably follows immediately after Step 1.

Step 3) Post-treatment ultrasonic washing in water.
Step 4) Drying at a low temperature.

In this first embodiment of the inventive method, the metal layer 1 is coated with a thin protective phosphate film 3. However, difficulties may be encountered in implementing the treatment for various reasons. That is, the treatment is highly aggressive because of the elevated temperature of the nitric acid, which mandates the availability of special equipment. Also, the treatment is not fully compatible with a composite wafer back metallization (e.g., of the TiNiAu type), and the method steps are best carried out before finishing the wafer back.

To overcome these difficulties, the invention provides a simpler treatment for the semiconductor wafer to make the method readily compatible with the process of fabricating the integrated circuit in a wafer. In this modified embodiment, the wafer is treated with a mixture of a polar organic solvent (e.g., acetonitrile or ethyl acetate) and phosphoric acid or phosphate derivatives thereof, at a temperature in the range of about 25 to 40° C. for a time between about 5 and 40 minutes. The process sequence and details of the various steps are as follows:

Step 1) Dipping the wafer in a mixture of polar organic solvent and a small proportion of phosphoric acid ($H_3PO_4$), e.g., 0.5 to 1% v/v phosphoric acid. Alternatively, the phosphate reactant is orthophosphoric acid or R—$H_xPO_y$, where R is an alkaline-type ion group or an alkyl radical:

temperature—25 to 40° C.;

time—5 to 40 minutes.

Step 2) Post-treatment ultrasonic washing in alcohol or water.

Step 3) Drying at a low temperature.

Figure 1B:
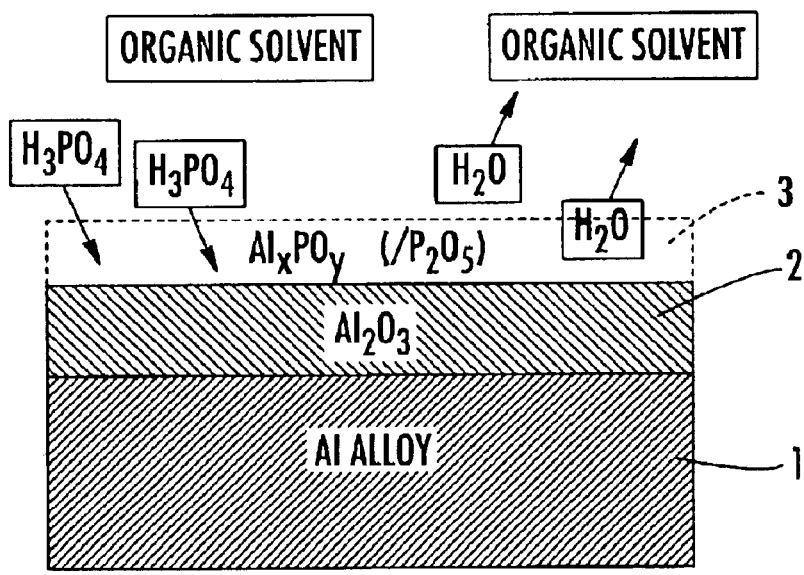
FIG. 1B is a schematic diagram of the substrate portion of FIG. 1A at a subsequent step of the inventive method.

Before applying the treatment according to this embodiment of the invention, the surface of the metallization layer 1 is coated with a thin (about 30 to 40 Å) layer 2 of native oxide hydrate $Al_2O_3 \cdot xH_2O$. The chemical reactions that take place on this surface during the first step of the inventive method are illustrated by FIGS. 1A and 1B.

In a further modification of the inventive method, the aluminum surface, as coated with the thin phosphate film 3 during the previous process steps (1), (2) and (3), is further treated thermally under an $N_2$ medium at a temperature of about 125° to 150° C. for about 1 hour. This additional step allows the phosphatised termination to be rebuilt by the formation of a layer of $AlPO_4$ phosphate precipitate, which is highly resistant to stress in hot steam. This conclusion is reached following an analysis of the XPS data presented on the respective graphs, discussed hereinafter with reference to FIGS. 2 to 5.

Figure 2:
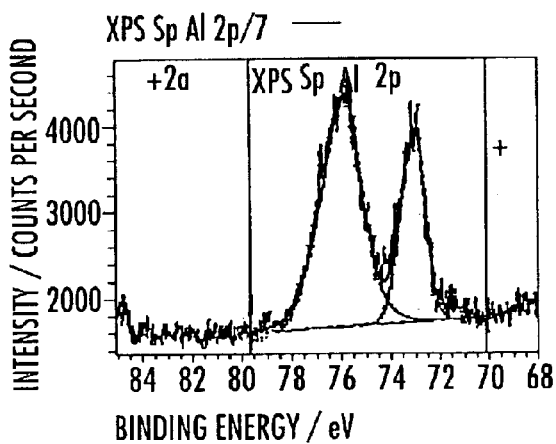
FIGS. 2–5 are XPS graphs or spectra illustrating schematically the results of test measurements, plotted as intensity vs. bonding energy, for semiconductor electronic devices produced in accordance with the inventive method.
Figure 3:
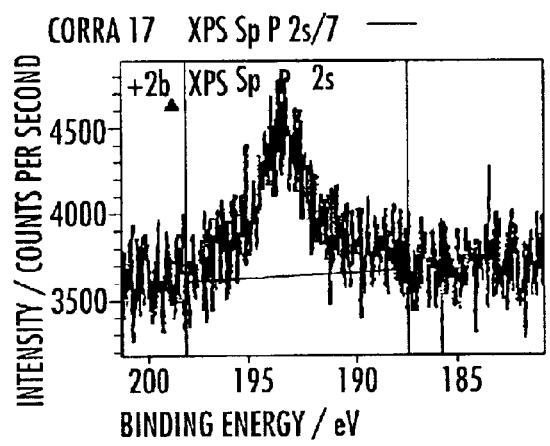
Figure 4:
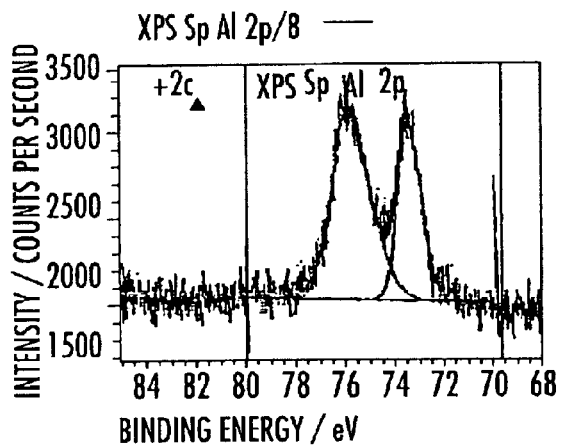
Figure 5:
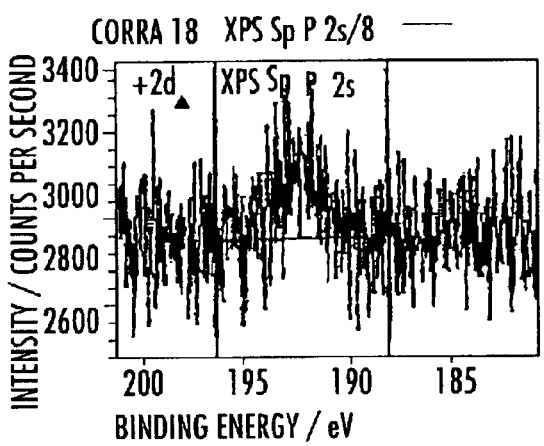

The above-mentioned thermal treatment results in the formation of a phosphate layer a few monolayers thick, either partly or fully cured. At this phosphate layer, the thickness of the dehydrated terminating alumina is less than the original one and attains a steady-state value which will depend on the treatment temperature. A possible process marker is provided by ESCA measures which characterize the surface chemistry in terms of both phosphorus content and thickness of the surface aluminum oxide. FIGS. 2 and 3 relate, for example, to the surface soon after growing the thin film 3 on the semiconductor wafer. FIGS. 4 and 5 relate to results obtained by opening mechanically a previously packaged device in plastics of an epoxy resin. More particularly, FIGS. 2 and 4 show the XPS spectrum for the aluminum, wherein the traces of the aluminum metal and the oxidized aluminum may be seen. FIGS. 3 and 5 include the phosphorus trace.

The method of the present invention solves the above technical problem and offers several advantages, foremost among which is the fact that the protective phosphate layer may prevent corrosion of the underlying metallization layer when placed in a damp environment. Furthermore, in the specific field of semiconductor integrated devices, the protective layer provided by the method of this invention enables direct bonding of the lead wires to the modified aluminum surface.

That which is claimed is:

1. A method for making a semiconductor device comprising:

forming at least one aluminum alloy metallization layer;

forming an aluminum oxide hydrate layer on the at least one aluminum alloy metallization layer; and forming a protective inhibitor layer comprising phosphate on the aluminum oxide hydrate layer for reducing corrosion of the at least one aluminum alloy metallization layer, the protective inhibitor layer further comprising at least one of ortho- and poly-phosphate grafted phases adjacent the aluminum oxide hydrate layer.

2. The method according to claim 1 wherein the protective inhibitor layer defines an outermost passivation layer.

3. The method according to claim 1 wherein the protective inhibitor layer is less than about 50 Å thick.

4. The method according to claim 3 wherein the protective inhibitor layer is less than about 35 Å thick.

5. The method according to claim 1 wherein the aluminum oxide hydrate layer is less than about 50 Å thick.

6. The method according to claim 5 wherein the aluminum oxide hydrate layer has a thickness in a range of about 30 to 40 Å.

7. The method according to claim 1 wherein the protective inhibitor layer comprises aluminum phosphate.

8. The method according to claim 1 wherein the protective inhibitor layer is cured.

9. A method of producing a protective inhibitor layer for reducing moisture-generated corrosion of aluminum alloy metallization layer in semiconductor devices comprising:

chemically treating an aluminum alloy metallization layer using concentrated nitric acid formed in a substantially non-aqueous solution at less than about 50° C.; and chemically treating the aluminum alloy metallization layer using a mixture comprising nitric acid and trace phosphoric acid formed in a substantially non-aqueous solution at less than about 50° C.

10. The method according to claim 9 wherein chemically treating the aluminum alloy metallization layer using concentrated nitric acid comprises dipping the electronic device in concentrated nitric acid for at least ten minutes at about 40° to 50° C.

11. The method according to claim 9 wherein chemically treating the aluminum alloy metallization layer using a mixture of nitric acid and trace phosphoric acid comprises dipping the electronic device in a mixture of nitric acid and trace phosphoric acid for about 10 to 20 minutes at about 40° to 50° C.

12. The method according to claim 9 wherein the amount of trace phosphoric acid is about 0.005 to 0.01% v/v.

13. The method according to claim 9 wherein chemically treating the aluminum alloy metallization layer using a mixture of nitric acid and trace phosphoric acid is performed after chemically treating the aluminum alloy metallization layer using concentrated nitric acid.

14. The method according to claim 9 further comprising ultrasonically washing the protective inhibitor layer in water.

15. The method according to claim 14 further comprising drying the protective inhibitor layer at a low temperature.

16. A method of producing a protective inhibitor layer for reducing moisture-generated corrosion of aluminum alloy metallization layers in semiconductor devices comprising:

dipping an aluminum alloy metallization layer in a mixture comprising a polar organic solvent and at least one of phosphoric acid, phosphate derivatives of phosphoric acid, and a phosphate reactant, the mixture being formed in a substantially non-aqueous solution at less than about 40° C.

17. The method according to claim 16 wherein the mixture comprises about 0.5 to 1% v/v of at least one of phosphoric acid, phosphate derivatives of phosphoric acid, and the phosphate reactant.

18. The method according to claim 16 wherein the phosphate reactant is orthophosphoric acid or $R-H_xPO_y$, where R is an alkaline type of ion group or an alkyl radical.

19. The method according to claim 16 further comprising ultrasonic washing the aluminum alloy metallization layer in at least one of alcohol and water.

20. The method according to claim 16 wherein dipping is performed at a temperature of about 20° to 40° C. for about 5 to 40 minutes.

21. The method according to claim 16 further comprising drying the aluminum alloy metallization layer at a low temperature for about 1 to 10 minutes.

22. The method according to claim 16 further comprising thermally treating the aluminum alloy metallization layer in a nitrogen atmosphere at a temperature of approximately 125° to 150° C. for about three hours.

23. The method according to claim 16 wherein the polar organic solvent comprises at least one of an acetonitrile or ethyl acetate.

* * * * *